United States Patent
Heid

(10) Patent No.: US 10,338,169 B2
(45) Date of Patent: Jul. 2, 2019

(54) TRANSMITTER DEVICE FOR A MAGNETIC RESONANCE SCANNER

(71) Applicant: Oliver Heid, Erlangen (DE)

(72) Inventor: Oliver Heid, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 476 days.

(21) Appl. No.: 15/054,777

(22) Filed: Feb. 26, 2016

(65) Prior Publication Data

US 2016/0252593 A1    Sep. 1, 2016

(30) Foreign Application Priority Data

Feb. 26, 2015  (DE) .......... 10 2015 203 457

(51) Int. Cl.
*G01V 3/00* (2006.01)
*G01R 33/36* (2006.01)

(52) U.S. Cl.
CPC ..... *G01R 33/3614* (2013.01); *G01R 33/3607* (2013.01); *G01R 33/3628* (2013.01)

(58) Field of Classification Search
CPC ............ G01R 33/3614; G01R 33/3621; G01R 33/3607; G01R 33/5612; G01R 33/3415; G01R 33/365; G01R 33/34007; H04B 5/0025; H04B 5/0037; H04B 5/0056; H04B 5/0075; H04B 5/0093; H02J 5/005
USPC ....................................................... 324/322
See application file for complete search history.

(56) References Cited

U.S. PATENT DOCUMENTS

| | | | |
|---|---|---|---|
| 5,202,657 A * | 4/1993 | Stopper | ............. H01P 3/081 333/238 |
| 5,986,454 A | 11/1999 | Leifer | |
| 6,683,457 B2 | 1/2004 | Heid | |
| 7,916,920 B2 | 3/2011 | Seifert et al. | |
| 8,803,365 B2 | 8/2014 | Lee et al. | |
| 2002/0180440 A1 | 12/2002 | Heid | |
| 2005/0242816 A1* | 11/2005 | Kurpad | ............ G01R 33/34046 324/322 |
| 2006/0049825 A1* | 3/2006 | Habara | .............. G01R 33/3607 324/207.2 |
| 2009/0302841 A1* | 12/2009 | Avdievich | .......... G01R 33/3415 324/309 |
| 2010/0166279 A1 | 7/2010 | Seifert et al. | |

(Continued)

FOREIGN PATENT DOCUMENTS

DE          10127266 C2    12/2003
DE      102007023542 A1    11/2008

(Continued)

OTHER PUBLICATIONS

Brennecke C.G.: Equivalent T and Pi Sections for the Quarter-Wavelength Line, Proc. IRE, Bd. 32, pp. 15-17, Jan. 1944.

(Continued)

*Primary Examiner* — Rodney E Fuller
(74) *Attorney, Agent, or Firm* — Lempia Summerfield Katz LLC

(57) ABSTRACT

A transmitter device for a magnetic resonance scanner includes a transmitter that is arranged in spatial proximity of a transmission coil that is connected thereto. The transmitter is embodied as a high-frequency power source that is connected directly to the transmission coil.

8 Claims, 4 Drawing Sheets

(56) References Cited

U.S. PATENT DOCUMENTS

| | | | |
|---|---|---|---|
| 2011/0227571 A1* | 9/2011 | Sekiguchi | G01R 33/3607 |
| | | | 324/307 |
| 2011/0227574 A1* | 9/2011 | Akita | G01R 33/3692 |
| | | | 324/322 |
| 2012/0146425 A1 | 6/2012 | Lee et al. | |
| 2014/0307764 A1 | 10/2014 | Adolf et al. | |
| 2014/0333147 A1 | 11/2014 | Lee et al. | |
| 2014/0347143 A1* | 11/2014 | Oppelt | H01P 1/18 |
| | | | 333/25 |
| 2015/0084510 A1* | 3/2015 | Miura | H02H 7/1213 |
| | | | 315/119 |
| 2016/0066808 A1* | 3/2016 | Hijazi | A61B 5/04085 |
| | | | 600/382 |
| 2016/0285389 A1* | 9/2016 | Sakai | H01S 3/1305 |
| 2018/0081004 A1* | 3/2018 | Yang | G01R 33/3614 |

FOREIGN PATENT DOCUMENTS

| | | |
|---|---|---|
| JP | S61233383 A | 10/1986 |
| JP | H08252237 A | 10/1996 |
| KR | 20120066281 A | 6/2012 |
| KR | 20140123449 A | 10/2014 |

OTHER PUBLICATIONS

Foster R.M.: A reactance theorem, Bell System Technical Journal, Bd. 3, No. 2, pp. 259-267, 1924.

German Search Report for related German Application No. 10 2015 203 457.7 dated Oct. 9, 2015, with English Translation.

\* cited by examiner

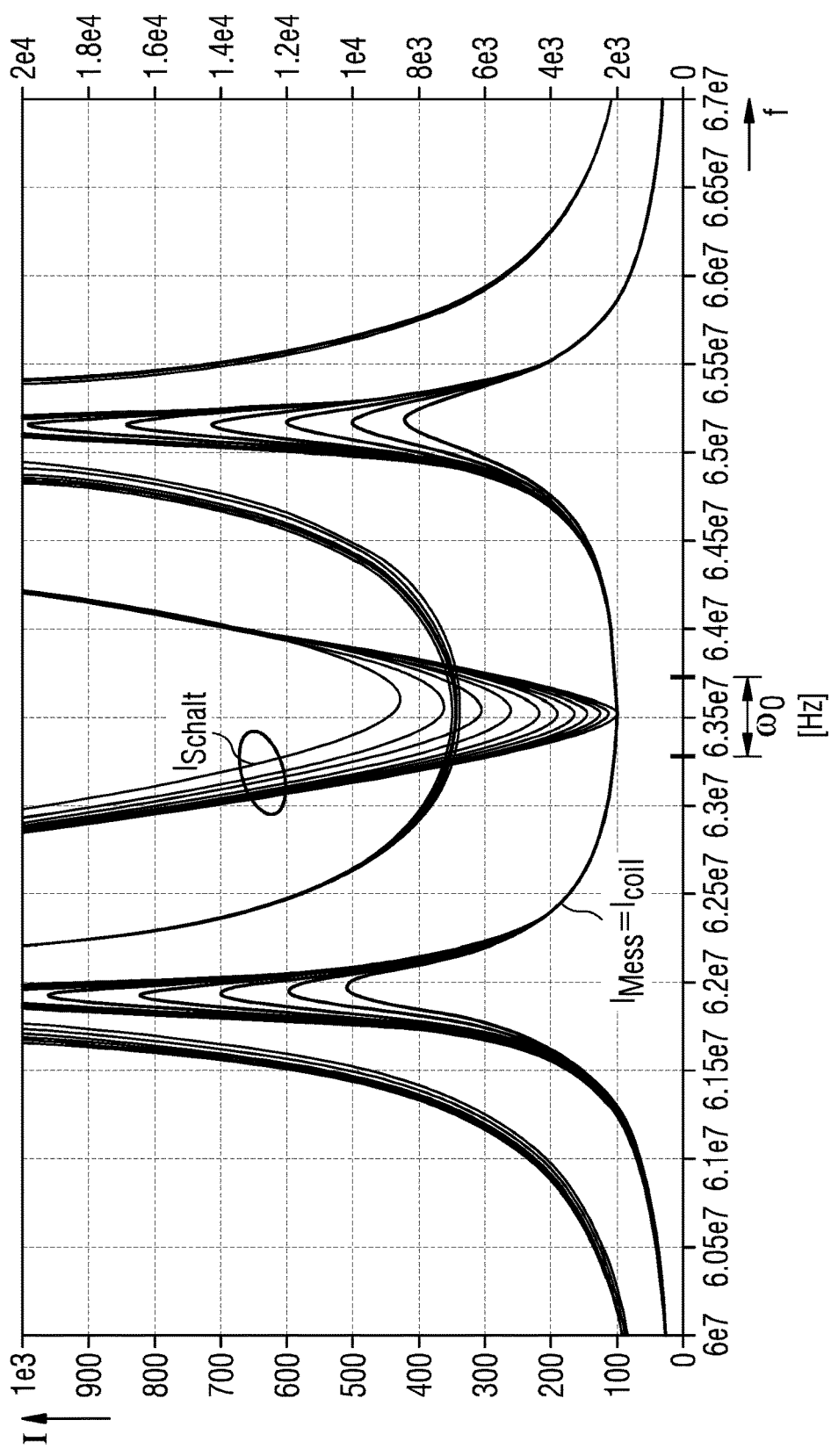

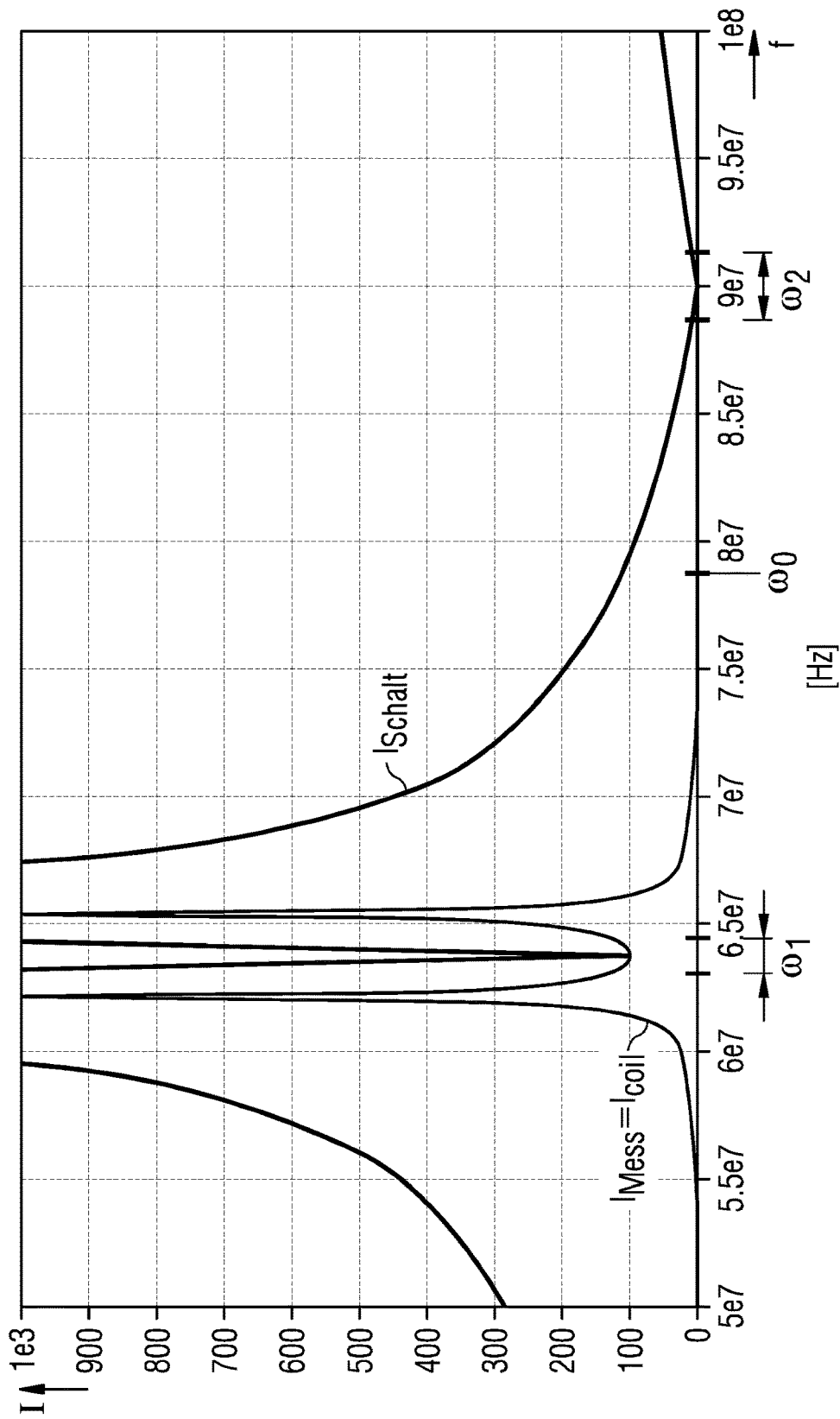

TRANSMITTER DEVICE FOR A MAGNETIC RESONANCE SCANNER

This application claims the benefit of DE 10 2015 203 457.7, filed on Feb. 26, 2015, which is hereby incorporated by reference in its entirety.

BACKGROUND

The present embodiments relate to a transmitter device for a magnetic resonance scanner having a transmitter that is arranged in the spatial proximity of a transmission coil that is connected thereto.

Magnetic resonance scanners include at least one transmission coil for generating a $B_1$ magnetic field. The transmitter may be composed of an analog, linear class AB transmitter with a defined output resistance (e.g., 50Ω), a coaxial cable with a defined characteristic resistance (e.g., 50Ω) for transferring the transmission power into the transmission coil, a power circulator with load resistance for conducting away from the transmitter the power reflected as a result of incorrect adaptation of the transmission coil, and of the transmission coil that generates the $B_1$ magnetic field in the object to be examined. The transmission coil is adjusted to resonate in the center of the desired frequency band, and adapted, for example, to the 50Ω input resistance with in each case at least one longitudinal capacitor and one transverse capacitor.

The arrangement has a strongly load-dependent and frequency-dependent $B_1$ magnetic field amplitude for a given transmission power. The transmission power is to be calibrated for the desired magnetic field amplitude in a load-dependent fashion. This process is referred to as "adjustment scan". Operation beyond the resonant frequency brings about a reduction in the $B_1$ magnetic field owing to the reactive incorrect adaptation to the circulator impedance. The transmission coil may therefore be adjusted to resonate to the load-dependent frequency band center before the actual measurement. The bandwidth that may be achieved therefore remains dependent on the coil quality and therefore on the object (e.g., a person) arranged in the transmission coil. The output power of the transmitter therefore has a variable effect with respect to the $B_1$ magnetic field that is generated, which makes it necessary both to adjust and to calibrate the output power of the transmitter after any change in the load.

A further disadvantage is that the transmission coil has limits with respect to the radio frequency (RF) energy that may be transmitted into the object and average power that may be transmitted into the object. During the operation of a magnetic resonance scanner, reduced RF amplitudes and pulse duty ratios may be readily possible without further limitations or degradation. This may not be ensured by conventional class AB transmitters in which the efficiency level and the average output power decrease greatly at large pulse duty ratios. However, this may lead to relatively poor image recording. Overdimensioning of the transmitter and of the power supply thereof in order to compensate for the efficiency level is, however, not readily possible in view of the maximum output power and the effects on the object to be examined in the transmission coil.

Such a transmitter device for a magnetic resonance scanner is known, for example, from DE 101 27 266 C2. In this transmitter device, in order to partially integrate the transmitter into the transmission coil, the field-generating wire loops thereof are connected to the voltage supply by switching elements that are installed in the field-generating wire loops and are actuated with a delay. As a result, adaptation and transmission elements, including a transmission cable as well as transformation elements for impedance matching to the coils, are largely dispensed with.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a transmitter device for a magnetic resonance scanner in which difficulties with adaptation of the transmission coil and limitations relating to the output power may be avoided, and that has a simple design is provided.

A transmitter device for a magnetic resonance scanner is provided with a transmitter that is arranged in spatial proximity to a transmission coil that is connected thereto. According to one or more of the present embodiments, the transmitter is embodied as a high-frequency power source that is connected directly to the transmission coil.

A direct connection between the high-frequency power source and the transmission coil may be that the connection between these components is made without a cable with a defined characteristic resistance (e.g., 50Ω) and without a corresponding matching network. Dispensing with a defined fixed feed impedance permits a load-impedance-independent current through the transmission coil and therefore a load-independent $B_1$ magnetic field amplitude. The transmission coil that is adjusted in a series-resonant fashion to a series capacitor changes reactance with detuning (e.g., broadband operation outside resonance) and a resistive load in the interior of the transmission coil. This may be compensated by the high-frequency power source, with the result that the magnetic field amplitude remains constant. Measurements and settings for adapting the impedance and adjusting the resonance are not necessary.

The high-frequency power source may be formed from a voltage source and a discrete λ/4 transformer. The discrete λ/4 transformer "transforms" the voltage present at the output of the voltage source into a current.

The discrete λ/4 transformer may be connected directly to the transmission coil. The discrete λ/4 transformer may be a low-pass filter (e.g., a π element), a high-pass filter, a λ/4 line, or a T element. The direct connection of the transmission coil and the high-frequency power source may be implemented via a non-homogeneous transmission line.

The voltage source may be formed from a clocked voltage source (e.g., chopper circuit) with a plurality of switching elements. The voltage source is fed from a direct voltage source during the operation of the transmitter device. The direct voltage source (e.g., in the form of a capacitor and a rectifier) may be fed from an alternating voltage power system. The clocked switching voltage source may be implemented, for example, as a switching power supply.

The switching elements of the clocked voltage source may be controlled in a digital or synchronous fashion during the operation of the transmitter device. As a result of this, amplitude modulation is produced based on a timing pattern of the actuation of the switching elements and a frequency of a switching clock. In this context, during the operation of the transmitter device during the amplitude modulation, two side bands are produced symmetrically about the frequency of the switching clock. One side band is the frequency band of the transmission coil that is to be transmitted. During the operation of the transmitter device, no power may be implemented in the other of the two side bands. This provides that the other of the two sides bands may come to be located at a parallel resonance point of the λ/4 transformer with connected series-resonant coil in the spectrum.

The transmission coil may, as already described above, have an inductor and a capacitor that is connected in series therewith. The inductor and the capacitor are adjusted in a series-resonant fashion. During the operation of the transmitter device, the current that flows through the transmission coil may be kept constant in that when the reactance of the transmission coil changes owing to detuning and/or resistive loading, the feed voltage of the voltage source is varied. The feed voltage of the voltage source may be varied automatically when detuning and/or resistive loading occur.

As a result, the transmitter device of one or more of the present embodiments solves the problem of $B_1$ magnetic field generation through the use of high-frequency power sources in a coil inductor (e.g., transmission coil) that is series-resonant as a result of a series capacitor. The high-frequency power source is implemented by a λ/4 transformation of a clocked voltage source. Dispensing of a defined fixed feed impedance permits a load-impedance-independent coil current and therefore the searched-for, load-independent $B_1$ magnetic field amplitude. For this purpose, the transmitter is mounted directly on the transmission coil, since otherwise, lines of a significant length would give rise to standing waves that would generate high voltages and currents along the line. The series-resonant coil changes reactance with the detuning (e.g., the broadband operation outside resonance) and the resistive loading within the transmission coil. This gives rise only to an increase in the feed voltage requirement, while the $B_1$ magnetic field amplitude remains constant. Measurements and capacitor settings are unnecessary for adjusting the impedance and detuning the resonance.

BRIEF DESCRIPTION OF THE DRAWINGS

FIG. 4 shows a diagram in which the current through the coil as a function of different degrees of loading is plotted against the frequency; and FIG. 5 shows a diagram, in which the side bands of the coil current that arise during operation of the transmitter device are illustrated symmetrically about a frequency of a switching clock.

DETAILED DESCRIPTION

Figure 1:
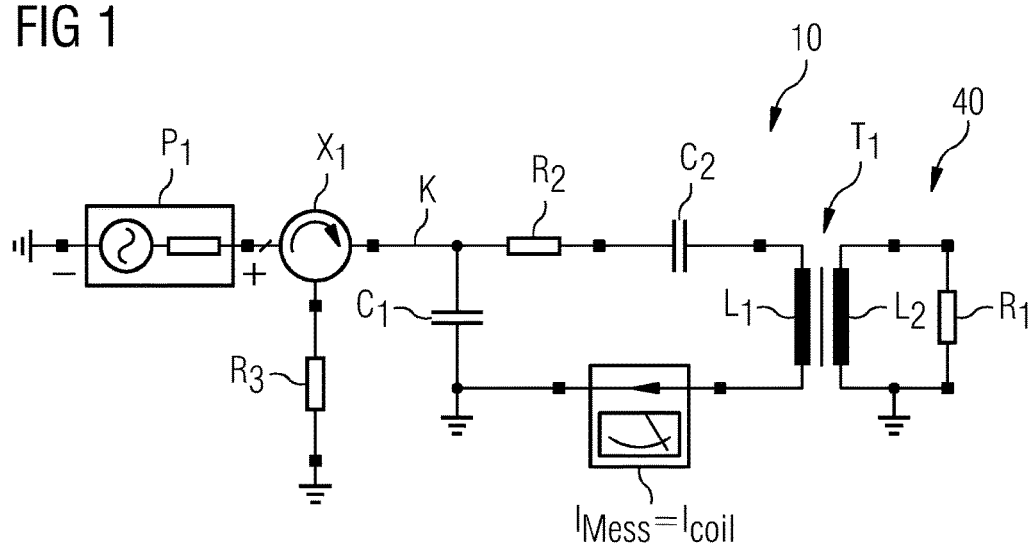
FIG. 1 shows an electrical equivalent circuit diagram of a conventional transmitter device.

FIG. 1 shows a schematic equivalent circuit diagram of a conventional transmitter device for a magnetic resonance scanner. The transmitter device includes an analog transmitter $P_1$, for example, in the form of an analog linear class AB transmitter that has a defined output resistance (e.g., 50Ω). The transmission power that is generated by the transmitter $P_1$ is transmitted to a transmission coil 10 via a transmission line K (e.g., a coaxial cable with a defined characteristic resistance (50Ω)). The transmission coil 10, represented by the inductor $L_1$, is coupled as a transformer (represented by the transformer $T_1$) to a load 40. The load 40 is, for example, a patient who is represented in the electrical equivalent circuit diagram by an inductor $L_2$ and a resistor $R_1$ connected in parallel. The transmission coil 10 and the inductor $L_1$ are adjusted to resonate in the center of a desired frequency band with a longitudinal capacitor $C_2$ and a transverse capacitor $C_1$ and are adapted to the characteristic resistance of the transmission line K (e.g., 50Ω). A resistor $R_2$ that is connected in series to the capacitor $C_2$ represents a resistance of the transmission coil 10. In order to detect the current flowing through the transmission coil 10, a current-measuring device $I_{Meas}$ is also present in the resonance circuit. In addition, a power circulator $X_1$ is present in the transmission line K and is connected by a first connection to the transmitter $P_1$, by a second connection to the transmission line K, and by a third connection to a load resistor $R_3$. The circulator $X_1$ is adapted to the characteristic resistance of the transmission line K and serves to conduct away from the transmitter $P_1$. The power of this is reflected by incorrect adaptation of the transmission coil 10.

Figure 2:
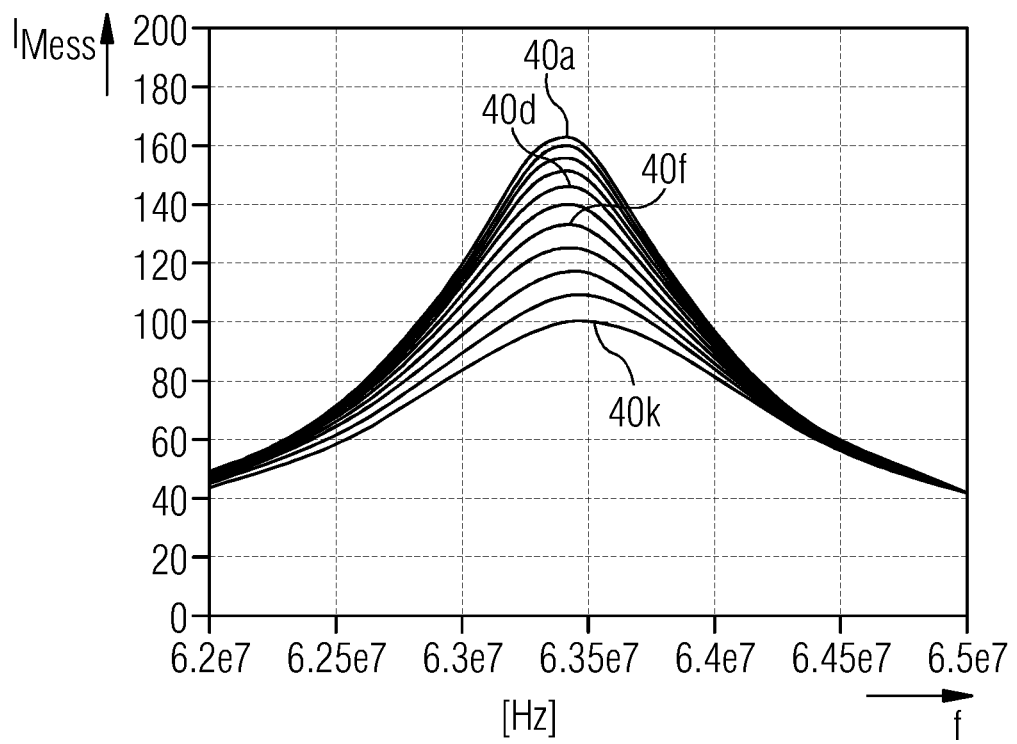
FIG. 2 shows a diagram in which a current through the transmission coil is plotted at different loads as a function of a frequency in the transmitter device from FIG. 1.

The arrangement that is shown in FIG. 1 has a strong load-dependent and frequency-dependent $B_1$ magnetic field amplitude for a given transmission power of the transmitter $P_1$. Therefore, the transmission power is to be calibrated in a load-dependent fashion for the desired magnetic field amplitude. The effects of loads of different magnitudes (e.g., patients of different sizes and/or weights in a magnetic resonance scanner) are evident through a different current through the transmission coil 10. This may be inferred, for example, from the curve family for loads of different magnitudes 40a, . . . , 40k in FIG. 2, where the current $I_{Meas}$ flowing wing through the inductor $L_1$ is illustrated as a function of the frequency f. The transmission coil 10 is adjusted, as is readily apparent from FIG. 2, to a resonant frequency of just under 63.5 MHz. In order to avoid this variation of the coil current and therefore of the magnetic field as a function of the load, the load-dependent frequency band center is to be adjusted to resonate before the actual measurement. In addition, operation beyond the resonant frequency brings about a reduction in the $B_1$ magnetic field owing to the reactive incorrect adaptation to the circulator impedance of the circulator $X_1$.

Figure 3:
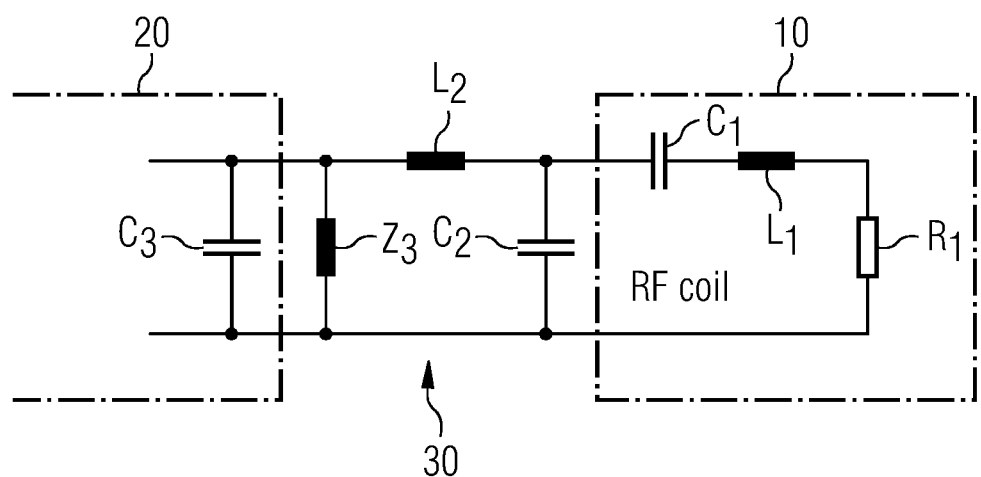
FIG. 3 shows a schematic equivalent circuit diagram of one embodiment of a transmitter device.

FIG. 3 shows a schematic equivalent circuit diagram of a transmitter device according to one or more of the present embodiments for a magnetic resonance scanner. In this schematic illustration, the transmission coil 10 is supplied with current from a high-frequency power source that is formed from a voltage source 20 and a discrete λ/4 transformer 30. The transmission coil 10, represented by the inductor $L_1$, a capacitor $C_1$ that is connected in series thereto, and a coil resistor $R_1$, is adjusted in a series-resonant fashion by a corresponding configuration (e.g., of the capacitor $C_1$). The transmission coil 10 is connected directly (e.g., without adaptation to a specific characteristic resistance and without the presence of a matching network). In other words, the transmission coil 10 is connected to the voltage source 20 via the λ/4 transformer 30.

Dispensing with a defined fixed feed impedance permits a load-impedance-independent coil current and therefore a load-independent $B_1$ magnetic field amplitude of the transmission coil 10. The series-resonant coil 10 changes reactance with the detuning (e.g., the broadband operation outside resonance) and resistive loading by a load (not illustrated in FIG. 3). The load couples as a transformer, as has been illustrated in conjunction with FIG. 1, to the inductor $L_1$ of the transmission coil 10. Both bring about an increase in the feed voltage requirement, while the $B_1$ magnetic field amplitude remains constant. Measurements and capacitor settings for matching the impedance and detuning the resonance are unnecessary.

The voltage source 20 is implemented based on clocked switching voltage sources, referred to as choppers. The voltage that is formed by the voltage source is transformed by the λ/4 transformer 30 into the current that is used by the transmission coil 10. The voltage source 20 is fed from a direct voltage source (no longer illustrated), which is fed, for example, in the form of a capacitor ($C_3$) and a rectifier (not illustrated) from an alternating voltage power system (not illustrated in more detail).

Switching elements of the clocked switching voltage sources are controlled in a digital and synchronous fashion. The timing bit pattern of the switch positions and the switching clock result in AM modulation in which two side bands are produced symmetrically about a desired switching clock frequency. This may be inferred schematically from, for example, the diagram in FIG. 5. The desired switching clock frequency is, for example, characterized by $\omega_0$ and is approximately 78 MHz. The side band that is characterized by $\omega_1$ yields the frequency band that is to be transmitted (e.g., in the region from approximately 63 to 64 MHz). The other side band $\omega_2$ does not implement any power and therefore also does not give rise to a switching current either. This results in the side band $\omega_2$ coming to be located at a parallel resonance point of the λ/4 transformer circuit with a connected series-resonant coil (e.g., transmission coil) in the spectrum.

FIG. 4 shows a diagram in which a current $I_{Meas}=I_{coil}$ that flows through the transmission coil 10 and the current $I_{Switch}$ of the high-frequency power source that is produced to drive the coil current, plotted against the frequency f, are illustrated. As shown, in the frequency range that is characterized by coo, the current $I_{Meas}$ flowing through the transmission coil 10 is virtually constant independently of a load. In contrast, the current $I_{Switch}$, supplied by the high-frequency power source, varies with different loads (e.g., patients) in the transmission coil 10. The load variation is apparent from the curve family with different curve profile of the current of the high-frequency power source.

As has already been described above, when a high-frequency power source is used to drive a transmission coil of a magnetic resonance scanner, there is no need for matching elements, circulators, or diverter resistances to be provided. As a result, there is also no need for feed lines, since the transmitter device is connected in spatial proximity directly to the transmission coil. A decisive advantage of the use of high-frequency power sources is the high efficiency level irrespective of the load impedance. For example, it is not necessary to implement overdimensioning in order to compensate the efficiency level in the case of high pulse duty ratios and low amplitudes. Modulation may be implemented by activating a relatively large number of parallel power sources only partially.

Since digital high-frequency power sources are not available as such, the digital high-frequency power sources are, as described above, implemented by a λ/4 transformation from clocked switching voltage sources. For this purpose, pulse generator ICs may be used. These are known as digital, programmable square-wave power generator circuits for driving, for example, piezo-electric ultrasound transmitters. Such pulse generators represent square-wave voltage sources. If such a voltage source is connected to an impedance inversion circuit such as the λ/4 transformer, the voltage source provides a load impedance of $$Z_{load} = \frac{Z_0^2}{Z_{coil}} \quad (1)$$

The characteristic impedance $Z_0$ determines substantially the ratio of the high-frequency input voltage and of the high-frequency output voltage:

$$I_{mess} = I_{coil} = \frac{U_{source}}{Z_0} \quad (2)$$

An "open" output of the pulse generator would cause the RF transmission coil 10 to short circuit. Inactive pulse generators are therefore to be coupled actively to a reference potential. Ultrasonic pulse generator ICs have three output levels +Vc, 0 and −Vc, where the state "0" is active coupling to the reference potential with which there is the possibility of a bidirectional flow of current.

A reversal of impedance may be brought about by suitable transmission lines. Suitable topologies for such λ/4 transformers may be, for example, T elements or π-low-pass elements. This is described, for example, in the publication C. G. Brennecke: "Equivalent T and Pi Sections for the Quarter-Wavelength Line", Proc. IRE, Vol. 32, pp. 15-17, January 1944. Owing to the presence of a shunt capacitor $C_3$ (cf. FIG. 3) at the output of the pulse generator 20 and the capacitor $C_2$ for series-resonant adjustment of the coil $L_1$, the λ/4 transformer with merely two additional elements $L_2$ and $C_2$, as illustrated in FIG. 3, may cope. In this context:

$$L_2 = \frac{Z_0}{\omega_0}, \quad (3)$$

$$C_2 = \frac{1}{\omega_0 Z_0} \quad (4)$$

A third reactance element $Z_3$ serves here to bring about a large load impedance of the pulse generator switch in the range of $\omega_s-\omega_0$. The parallel connection of the reactance element $Z_3$ and of the shunt capacitor $C_3$ are to have a combined reactance of $-jZ_0$ at $\dot{u}_0$ The circuit brings about two series resonances that are below and above the operating frequency range $\omega_0$, as is shown by FIG. 5 with the side bands $\omega_1$ and $\omega_2$. In the case of $$\frac{1}{\omega_0^2} = L_1 C_1 = L_2 C_2, \sigma = \frac{L_2}{L_1} = \frac{C_1}{C_2}, Q = \frac{\omega_0 L_1}{R_1}, s = j\frac{\omega}{\omega_0} \quad (5)$$

the pulse generator load admittance is $$\frac{I_{source}}{U_{source}} = \frac{1}{Z_0} \frac{s^5 - \frac{s^4}{Q} + (3+\sigma)s^3 - \frac{2s^2}{Q} + (2+\sigma)s}{s^4 - \frac{s^3}{Q} + (2+\sigma)s^2 - \frac{s}{Q} + 1} \quad (6)$$

For high coil qualities Q→∞, the series resonance is therefore $$\omega_s = \omega_0 \sqrt{1 + \frac{\sigma}{2} \pm \sqrt{\sigma + \frac{\sigma^2}{4}}} \approx \omega_0 \left(1 \pm \frac{\sqrt{\sigma}}{2} + \frac{\sigma}{8}\right) \quad (7)$$

The parallel resonance when $\omega_p = \omega_0\sqrt{2+\sigma}$ may be used to suppress undesired AM modulation side bands when $$|2\omega_0 - \omega_s| \quad (8)$$

if the pulse generator is operated with a fixed frequency $\omega_s$. The coil current is $$\frac{I_{coil}}{U_{source}} = \frac{\sigma}{Z_0} \frac{s}{s^4 - \frac{s^3}{Q} + (2+\sigma)s^2 - \frac{s}{Q} + 1} \quad (9)$$

with the result that the current transformation ratio is $$\frac{I_{coil}}{I_{source}} = \frac{\sigma}{s^4 - \frac{s^3}{Q} + (3+\sigma)s^2 - \frac{2s}{Q} + 2 + \sigma}. \quad (10)$$

In the case of the operation frequency s=j, this results in $$\frac{I_{coil}}{U_{source}}(\omega_0) = \frac{j}{Z_0}, \quad \frac{I_{coil}}{I_{source}}(\omega_0) = j\sigma Q \quad (11)$$

in accordance with formula (2).

From the publication R. M. Foster: "A reactance theorem," Bell System Technical Journal, Vol. 3, No. 2, pp. 259-267, 1924, the coil series reactance $L_1$ is not compensated over a broader frequency band than is possible with a single series resonance. The reactance X of a series resonance circuit $C_1L_1$ has the frequency dependence $$\frac{\partial X}{\partial \omega}(\omega_0) = 2L_1 \quad (12)$$

near to the resonant frequency $$\omega_0 = \frac{1}{\sqrt{L_1 C_1}}.$$

A moderate deviation increases the coil feed voltage requirement $$U_{coil} = (R_1 + 2j\Delta\omega L_1)I_{coil}$$

and gives rise to an additional reactive load current $$I_{source} = \frac{U_{coil}}{Z_0} \quad (14)$$

at the pulse generator. A relatively large number of pulse generators 30 that are connected in parallel may be provided.

Ultrasonic pulse generator ICs may be synchronized to a clock frequency $\omega_p$. The pulse pattern generates symmetrical spectral AM modulation side bands $\omega_0$, $2\omega_p - \omega_0$ below and above the frequency $\omega_2$ at the suppressed or gated-out carrier. This uses a switching clock $\omega_0$ outside the frequency band of the magnetic resonance scanner. One of the side bands (e.g., $\omega_1$) is the desired frequency spectrum, and the other of the side bands (e.g., $\omega_2$) is selected such that no additional losses or currents occur in the transmission coil $L_1$ (see current I switch at $\omega_2$). If a low-pass impedance inverter, as illustrated in FIG. 3, is used, the switching frequency may be employed, with the result that unnecessary side bands are located close to the second input parallel resonance frequency. The switching clock frequency may then be approximately 1.2 $\omega_0$ at $\omega_p$. The alias spectrum at $\omega_p - \omega_0 = 0.2\omega_0$ is insignificant owing to the pulse generator shunt inductance $L_3$.

A bit pattern controls the high-frequency output current in phase and amplitude. The influence of a spectral energy distribution in the individual pulses may be corrected by pre-correction. Numerical optimization of the bit pattern in terms of time and frequency may be provided.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A transmitter device for a magnetic resonance scanner, the transmitter device comprising:
    a transmitter that is arranged in spatial proximity to a transmission coil, the transmission coil being connected to the transmitter,
    wherein the transmitter is configured as a high-frequency power source that is connected directly to the transmission coil,
    wherein the high-frequency power source comprises a voltage source and a discrete λ/4 transformer,
    wherein the voltage source comprises a clocked switching voltage source with a plurality of switching elements, the voltage source being fed from an alternating voltage source during operation of the transmitter device, and
    wherein the plurality of switching elements of the clocked switching voltage source are controlled in a digital synchronous fashion during the operation of the transmitter device, as a result of which amplitude modulation is produced based on a timing pattern of actuation of the plurality of switching elements and a frequency of a switching clock.

2. The transmitter device of claim 1, wherein the discrete λ/4 transformer comprises a low-pass filter, a high-pass filter, a λ/4 line, or a T element.

3. The transmitter device of claim 1, wherein the direct connection of the transmission coil and the high-frequency power source is implemented via a non-homogeneous transmission line.

4. The transmitter device of claim 1, wherein the transmission coil comprises an inductor and a capacitor that is connected in series therewith, and
wherein the inductor and the capacitor are adjusted in a series-resonant fashion.

5. A transmitter device for a magnetic resonance scanner, the transmitter device comprising:
a transmitter that is arranged in spatial proximity to a transmission coil, the transmission coil being connected to the transmitter,
wherein the transmitter is configured as a high-frequency power source that is connected directly to the transmission coil,
wherein the high-frequency power source comprises a voltage source and a discrete $\lambda/4$ transformer, and
wherein during operation of the transmitter device, a current that flows through the transmission coil is kept constant in that when a reactance of the transmission coil changes owing to detuning, resistive loading, or a combination thereof, a feed voltage of the voltage source is varied.

6. The transmitter device of claim 5, wherein the discrete $\lambda/4$ transformer comprises a low-pass filter, a high-pass filter, a $\lambda/4$ line, or a T element.

7. The transmitter device of claim 5, wherein the direct connection of the transmission coil and the high-frequency power source is implemented via a non-homogeneous transmission line.

8. The transmitter device of claim 5, wherein the transmission coil comprises an inductor and a capacitor that is connected in series therewith, and
wherein the inductor and the capacitor are adjusted in a series-resonant fashion.

* * * * *